(12) United States Patent
Murata et al.

(10) Patent No.: US 10,984,992 B2
(45) Date of Patent: Apr. 20, 2021

(54) SPUTTERING TARGET

(71) Applicant: JX Nippon Mining & Metals Corporation, Tokyo (JP)

(72) Inventors: Shuhei Murata, Ibaraki (JP); Yasuhiro Yamakoshi, Ibaraki (JP); Kotaro Nagatsu, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 112 days.

(21) Appl. No.: 15/575,063

(22) PCT Filed: May 18, 2016

(86) PCT No.: PCT/JP2016/064667
§ 371 (c)(1),
(2) Date: Nov. 17, 2017

(87) PCT Pub. No.: WO2016/186119
PCT Pub. Date: Nov. 24, 2016

(65) Prior Publication Data
US 2018/0144912 A1 May 24, 2018

(30) Foreign Application Priority Data
May 21, 2015 (JP) .............................. JP2015-103981
Jun. 3, 2015 (JP) .................................. 2015-113150

(51) Int. Cl.
H01J 37/34 (2006.01)
C23C 14/34 (2006.01)

(52) U.S. Cl.
CPC .......... H01J 37/3423 (2013.01); C23C 14/34 (2013.01); C23C 14/3407 (2013.01); H01J 37/3417 (2013.01)

(58) Field of Classification Search
CPC .. C23C 14/34; C23C 14/3407; H01J 37/3417; H01J 37/3423
USPC ....................................... 204/298.12, 298.13
See application file for complete search history.

(56) References Cited

U.S. PATENT DOCUMENTS

| 5,538,603 | A | * | 7/1996 | Guo ..................... C23C 14/3407 |
|   |   |   |   | 204/192.12 |
| 6,117,281 | A | * | 9/2000 | Novbakhtian .......... C23C 14/35 |
|   |   |   |   | 204/192.12 |
| 6,875,325 | B2 |   | 4/2005 | Miyashita et al. |
| 9,685,307 | B2 |   | 6/2017 | Miyashita |
| 2002/0079217 | A1 | * | 6/2002 | Buehler .............. C23C 14/3407 |
|   |   |   |   | 204/298.12 |

(Continued)

FOREIGN PATENT DOCUMENTS

| JP | 2003-027225 A | 1/2003 |
| JP | 2003-226965 A | 8/2003 |
| JP | 2004-084007 A | 3/2004 |

*Primary Examiner* — Rodney G McDonald
(74) *Attorney, Agent, or Firm* — Howson & Howson LLP

(57) ABSTRACT

A sputtering target comprising a flat part and a tapered part, wherein a machined groove for use in ignition is arranged on a sputtering surface of the target. With the sputtering target of the present invention, the ignition failure rate during ignition (plasma ignition) can be reduced, and the sputtering process can be started stably. It is thereby possible to shorten the downtime of the device, and consequently contribute to improved throughput and enhanced cost performance.

17 Claims, 4 Drawing Sheets

(56) References Cited

U.S. PATENT DOCUMENTS

| | | |
|---|---|---|
| 2004/0089543 A1* | 5/2004 | Kim .................... C23C 14/3407 |
| | | 204/298.12 |
| 2005/0072668 A1 | 4/2005 | Kennedy et al. |
| 2008/0116066 A1* | 5/2008 | Miyashita ........... C23C 14/3407 |
| | | 204/298.12 |
| 2013/0240146 A1 | 9/2013 | Utano et al. |
| 2016/0071705 A1 | 3/2016 | Tsukamoto |
| 2016/0217983 A1 | 7/2016 | Oda |

* cited by examiner

[Fig. 2]

SPUTTERING TARGET

BACKGROUND

The present invention relates to a sputtering target capable of stably performing ignition (plasma ignition) during sputtering.

Demands for further thinning the wiring of semiconductor integrated circuits are increasing through successive generations, and sputtering, which is one type of physical vapor deposition method, is being used for forming thin films to be used as such wiring. In recent years, magnetron sputtering, which controls plasma based on electromagnetic force, is often used in order to increase the deposition rate of sputtering. In this type of state-of-the-art sputtering technique, a stable and easily controllable target is essential. If stable deposition cannot be performed due to the shutdown of the device caused by a plasma ignition failure or the occurrence of a voltage fluctuation, not only will the productivity deteriorate, it may also cause the degradation in the quality of the product. Moreover, if control is difficult, it may be difficult to start and maintain stable deposition when the deposition conditions are intentionally changed.

A sputtering target formed from tantalum is being used for forming barrier films of copper wires. A barrier film also needs to be formed in wiring holes with a high aspect ratio (ratio of depth of steps and opening), and it is necessary to control the deposition rate and stably form ultrathin films. Moreover, sputtering needs to be performed at a high power in order to increase the sputter yield, and demanded is a target with a low deposition rate that is advantageous for controlling the film thickness even under the foregoing conditions. Thus, the foregoing technology for controlling deposition plays a role in the development of PVD.

Tantalum targets having a purity of 4N5 (99.995 wt %) are being used from the perspective of general versatility, but tantalum targets substantially having a purity of 6N (99.9999 wt %) are also being used for suppressing, as much as possible, the degradation of adhesiveness of the film and the increase of leak currents caused by impurities. In recent years, these ultrahigh purity materials are often used in order to increase the freedom of wiring designs.

When the purity of the target material is increased, the target material becomes soft, and there are cases where it is difficult to control the quality of the target due to the uneven orientation of the texture after plastic working or the coarsening of crystals during recrystallization based on heat treatment. While these problems can be resolved to a certain extent by strictly controlling the production process of the target, even a high quality target produced in the manner described above encounters new problems when the operating environment of the target becomes more severe.

Meanwhile, sputtering is a phenomenon where the following cycle is continued successively; namely, a voltage is applied to a target as a cathode, primary electrons discharged from the target ionize the introduced Ar gas, the Ar ions are drawn toward and collide with the target as the cathode and sputter the target material and discharge secondary electrons, and once again ionize Ar. Here, ignition is required for generating plasma.

In this plasma ignition, conditions related to the ignition process, such as limiting the number of times that the re-ignition process can be performed in cases of an ignition failure, are becoming stricter in order to improve the film quality by reducing the introduced gas, improve the yield by shortening the voltage application time, and protect the device. Under the foregoing circumstances, an ultrahigh purity material tends to cause the ignition process to become unstable, and there is a dilemma of using a low purity product in order to improve the ignition success rate, or using a high purity product in order to improve the quality.

The problem here is only in the ignition process, which is the first stage of the deposition process, and the subsequent deposition process can be continued without any problem once the plasma is stabilized. Thus, considered was the production of a target comprising characteristics that would only affect the ignition process, and would not contribute to the subsequent deposition. Note that sputtering targets having a unique shape are described in following Patent Document 1 to Patent Document 4.

PRIOR ART DOCUMENTS

Patent Documents

Patent Document 1: International Publication No. WO2006/054409
Patent Document 2: Japanese Patent Application Publication No. 2003-226965
Patent Document 3: Japanese Patent Application Publication No. 2003-27225
Patent Document 4: Japanese Patent Application Publication No. 2004-84007

SUMMARY

The present invention was devised in view of the foregoing circumstances, and an object of this invention is to provide a sputtering target capable of stably starting the sputtering process without requiring any reattempt or device shutdown caused by an ignition failure upon performing plasma ignition (ignition) during sputtering. In particular, the present invention aims to provide a sputtering target capable of stably starting the sputtering process even under circumstances that are disadvantageous for ignition such as the use of high purity materials and the reduction of introduced gas.

Based on the foregoing discovery, the present invention provides the following technologies:

1) A sputtering target comprising a flat part and a tapered part, wherein a machined groove is arranged on a tapered part of the sputtering target.

2) The sputtering target according to 1) above, wherein an area ratio of the machined groove of the tapered part is 0.6% or more.

3) The sputtering target according to 1) or 2) above, wherein an area ratio of the machined groove of the flat part is 10% or less. 4) The sputtering target according to any one of 1) to 3) above, wherein a depth of the machined groove is 0.1 mm or more.

5) The sputtering target according to any one of 1) to 4) above, wherein the sputtering target is formed from tantalum having a purity of 4N5 or higher.

The sputtering target of the present invention can reduce the ignition failure rate during ignition (plasma ignition) even under conditions where the introduced gas has decreased or the voltage application time is shortened, and enables to start the sputtering process stably. Since it is thus possible to shorten the downtime of the device, the present invention can contribute to improved throughput and enhanced cost performance.

DETAILED DESCRIPTION

The sputtering target of the present invention is characterized in that a machined groove for use in ignition is arranged on a tapered part of the sputtering surface. The machined groove arranged as described above can considerably contribute to the generation and stabilization of ignition because it can facilitate an electron avalanche upon generating plasma. While this mechanism is not necessarily clear, it is considered that, because the angle in which the primary charged particles (Ar ions, electrons) enter the machined groove of the target becomes shallow, the secondary electron discharge probability can be improved.

Moreover, it is also considered that, because the repulsion of the same type of charged particles decreases at the edges of the machined groove, concentration of electric fields occurs, and the secondary electron discharge probability is thereby improved. Because secondary electrons are generated in a manner of spreading in all directions with the point of entry of the primary charged particles as the origin, the discharge probability of secondary electrons increases at a sloped part in comparison to a flat part. Furthermore, it is also considered that, due to the unevenness of the machined surface, the scatter count of gas components and charged particles increases and, consequently, the collision count of charged particles is increased and the ionization rate is improved.

In any case, as shown in the ensuing Examples, the ignition failure rate during ignition can be dramatically reduced by forming a machined groove on a tapered part of the sputtering surface. Note that, in the present invention, the term "sputtering surface" refers to the surface of the sputtering target that is exposed to plasma. And the term "tapered part" refers to the part that is subject to chamfering at the outer peripheral part on the sputtering surface of the sputtering target, and is a part that does not substantially contribute, or hardly contributes, to the deposition. Moreover, the term "flat part" refers to the part of the sputtering surface excluding the tapered part which substantially contributes to the deposition.

Figure 1:
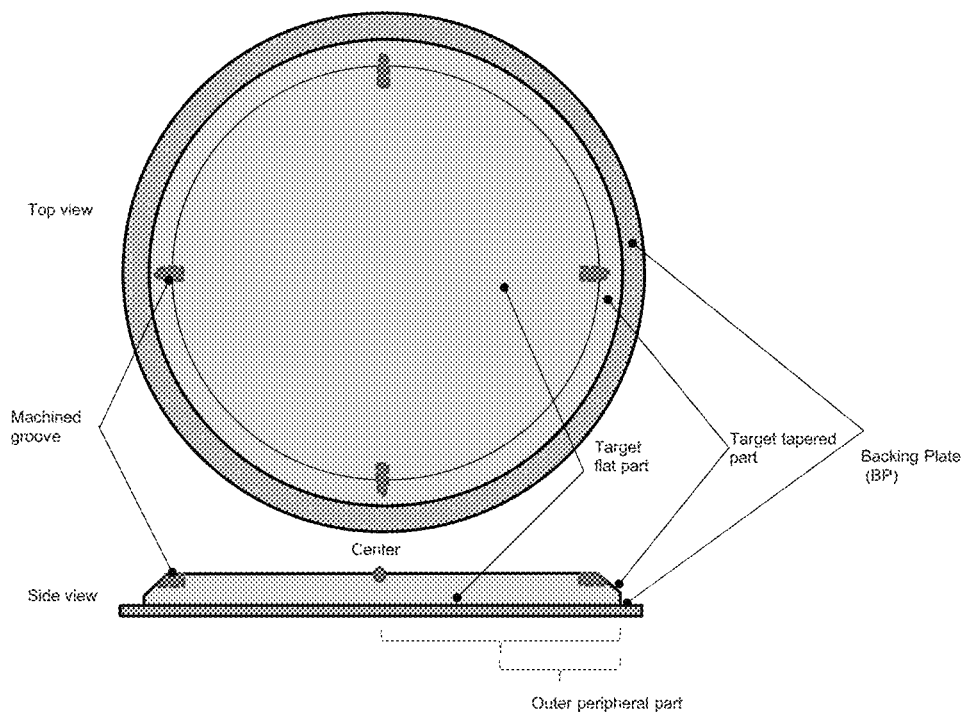
FIG. 1 is a schematic diagram explaining the sputtering target of the present invention.

The sputtering target of the present invention is now explained with reference to FIG. 1. FIG. 1 (upper diagram) shows the sputtering surface of the sputtering target, and FIG. 1 (lower diagram) shows the cross section of the sputtering target. Note that FIG. 1 merely shows one mode for facilitating the understanding of the present invention, and the present invention is not limited to this mode. The present invention covers all of the various modifications other than the modes explained below.

A machined groove is normally formed on the tapered part of the sputtering surface of the target, but it may also be formed across the flat part (surface that is parallel with the opposing wafer surface) as shown in FIG. 1 in addition to the tapered part. In the foregoing case, the machined groove is preferably formed at a part (low erosion region) in which the erosion of the target surface is shallower than ⅔ of the deepest part of the erosion and which is hardly involved in the deposition. This is because, at the parts where erosion advances quickly, the amount of magnetic flux leakage caused by the machined groove will change, and the current-voltage change during deposition will be considerably affected.

In the present invention, a machined groove is preferably formed at a flat part or a tapered part located at the outer peripheral part of the target (outer region from half the length from the center of the target to the outermost edge including the tapered part of the target). Whether to form the machined groove only on the tapered part or on both the tapered part and the flat part depends on the specification of the sputtering device and, therefore, may be suitably selected according to the specification of the sputtering device. Moreover, this kind of machined groove can be formed by cutting the sputtering target surface, or via knurling (method of forming concavo-convex grooves on the surface of the material by using a pressing piece or a cutting piece) or other machining methods.

Moreover, while the machined groove may be arranged at one location or two locations, a plurality of machined grooves are preferably arranged symmetrically vertically and horizontally at 4 locations, 8 locations, 16 locations or 32 locations on the target. As a result of arranging the machined grooves as described above, the stability of ignition can be improved as a result of the machined grooves applying influence at least every ¼ second relative to roughly one rotation/second of the magnet in a magnetron sputtering device.

Figure 2:
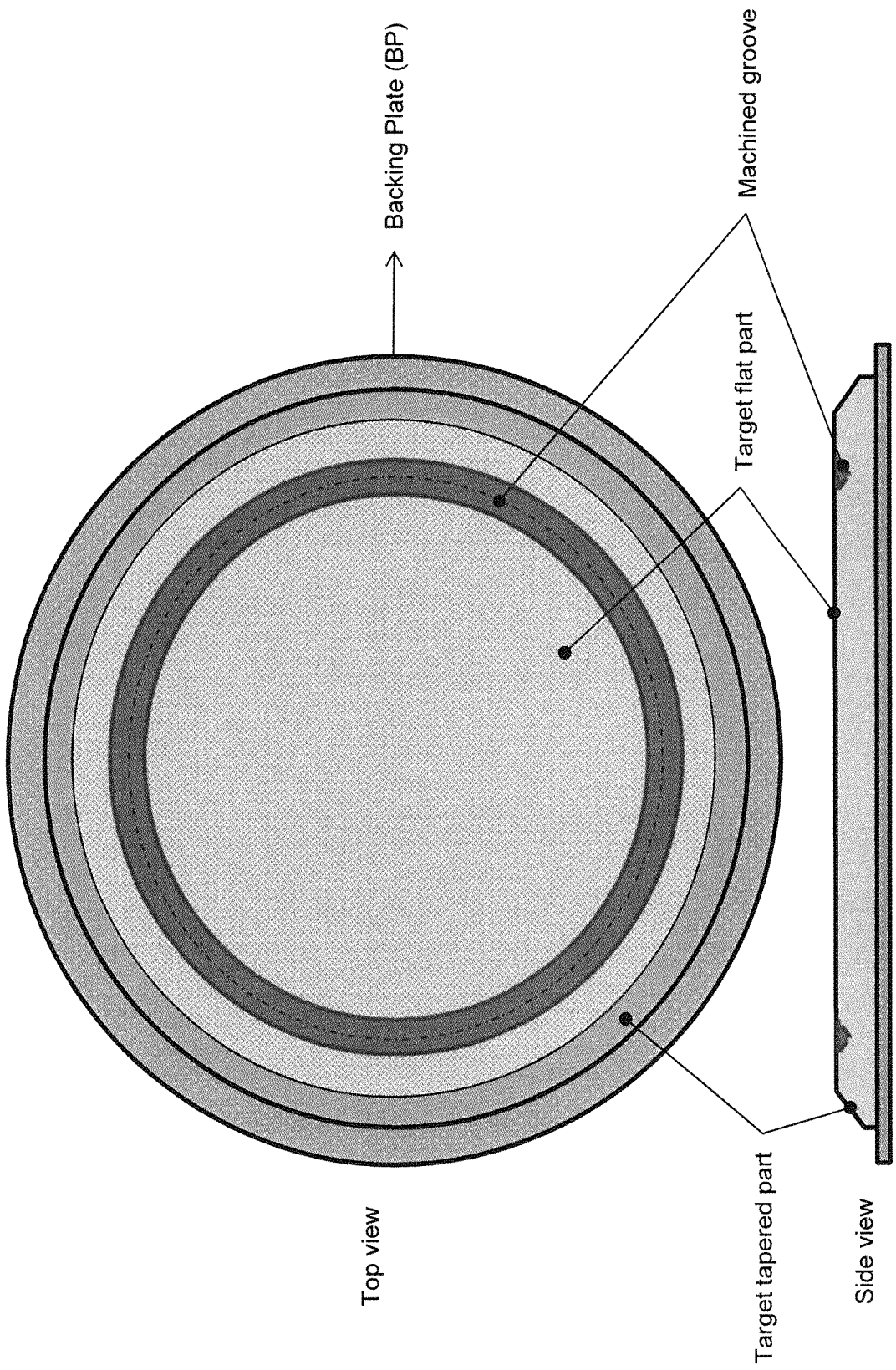
FIG. 2 is a schematic diagram explaining the sputtering target of a comparative example (concentrically machined groove).
Figure 3:
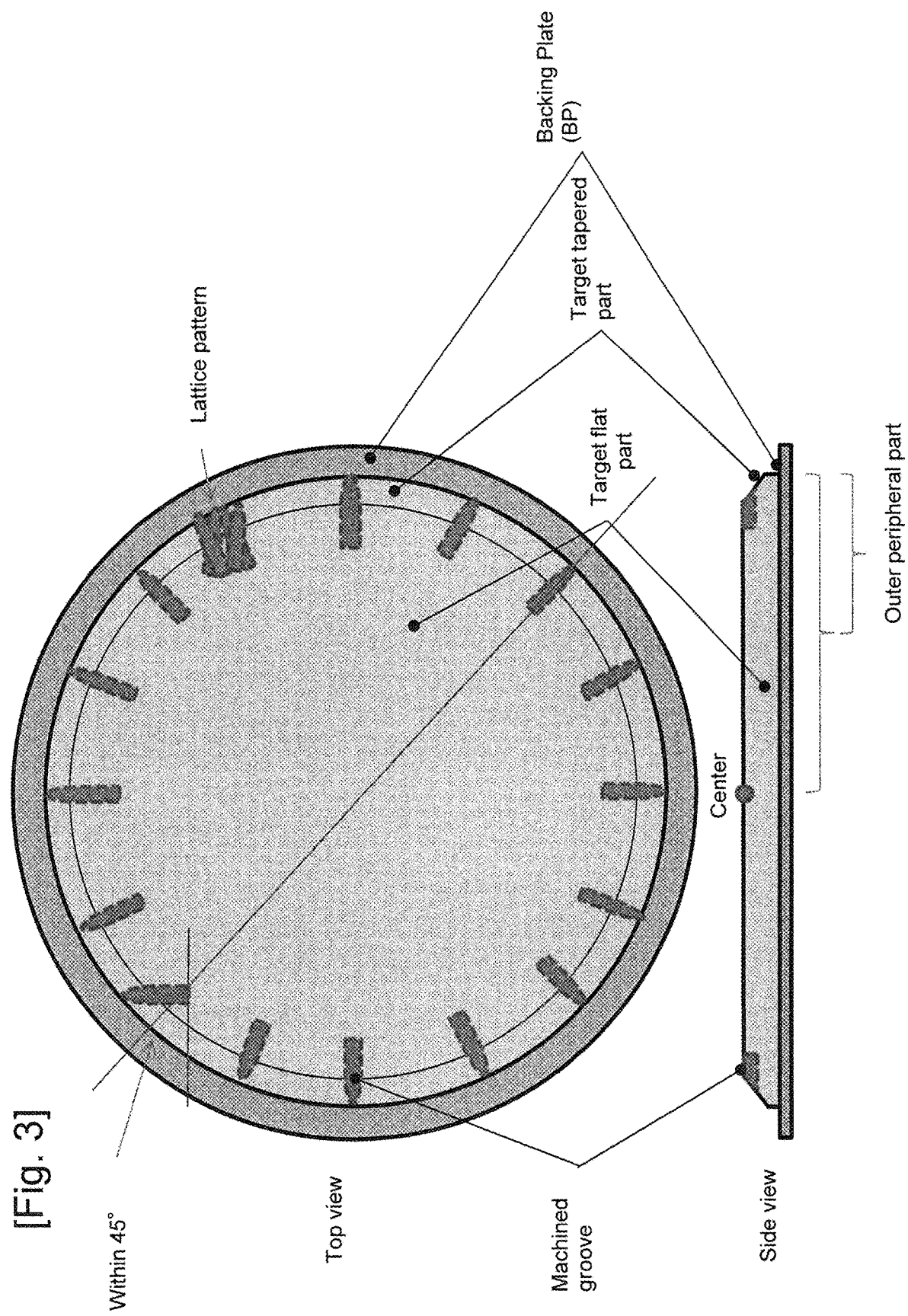
FIG. 3 is a schematic diagram explaining the sputtering target of the present invention (radially machined groove).

A machined groove is more effective when formed radially (in a radial line originating from the center of the target) as shown in FIG. 3 rather than being formed concentrically as shown in FIG. 2, and the decrease in the effect associated with the erosion (life dependence) is also minimal. In particular, the machined groove is preferably formed in parallel with the diametrical direction of the target or within a range where the angle formed with the diametrical direction of the target is less than 45 degrees. Moreover, while the machined grooves do not necessarily need to be formed at even intervals when focusing on the ignition effect, when giving consideration to the profile stability of the sputtered film thickness distribution and dust prevention, the machined grooves are preferably formed at even intervals.

The cross section of the machined groove may take on a V-shape, a U-shape, or a square-shape, and these shapes may be selected or combined according to the ease of workability and the generation status of foreign substances.

While there is no particular limitation regarding the depth of the machined groove because it does not affect the foregoing area ratio, it is preferably 0.3 mm or more from the perspective of workability. Moreover, for grooves that form an angle with the diametrical direction of the target, as shown in FIG. 3, a plurality of grooves intersecting in two different directions may be formed to configure a lattice shape. It goes without saying that the positioning, angle formed with the diametrical direction, shape, and number of machined grooves to be formed can be suitably selected according to the specification of the sputtering device and other factors.

When forming a machined groove on a tapered part of the target, the area ratio of the machined groove is preferably 0.6% or more. In the present invention, the term "area ratio of the machined groove" refers to the area of the groove that is projected on the sputtering surface, in which the groove is formed by cutting via machining. When the area ratio of the machined groove on the tapered part is less than 0.6%, the effect of stabilizing the ignition may deteriorate. Meanwhile, when a groove is formed across the flat part of the target, the area ratio of the machined groove is set to be, at maximum, 10% relative to the flat part.

When the area ratio of the machined groove on the flat part exceeds 10%, the current value during sputtering may decrease, and the applied power may become unstable. Note that, because the tapered part does not affect the applied voltage during sputtering, the tapered part is not included in the calculation of the area ratio described above. Moreover, because the formation of the machined groove on the foregoing tapered part is effective in improving the ignition, a machined groove does not necessarily need to be formed on the flat part. In the foregoing case, the area ratio of the machined groove on the flat part will be 0%.

For example, in a sputtering target having a diameter of 444 mm (sputtering surface: diameter of 406 mm, tapered part: surface outside the target of 406 mm in diameter), when a machined groove having a U-shaped cross section with a width of 6 mm, a length of 13 mm on the flat part and 12 mm on the tapered part, and a depth of 3 mm is formed at four locations on the sputtering surface (flat part), the area ratio of the machined grooves on the sputtering surface of the target will be $(6 \times 13 \times 4)/(\text{T} \text{r} \times 203^2) \times 100 \approx 0.24 (\%)$. Note that, under the projected area, while there may be cases where the areas are the same but the shapes are different, differences in shapes hardly have any influence from the perspective of improving the secondary electron discharge probability based on concentration of electric fields or edge effects.

The foregoing machined grooves are related to the shape of the sputtering target, and yield the effect of improving ignition irrespective of the material or composition of the target. Nevertheless, the machined grooves can more effectively exhibit their functions when used in a sputtering target formed from a high purity material in which ignition tends to become unstable; for instance, in a tantalum target having a purity of 4N5 (99.995%) or higher for forming barrier films of copper wires. Note that, in the present invention, "purity of 4N5 (99.995%)" refers to the purity upon analyzing a molten Ta ingot via glow discharge mass spectrometry (GDMS), and in which the total value of Na, Al, Si, K, Ti, Cr, Mn, Fe, Co, Ni, Cu, Zn, and Zr is less than 50 ppm.

EXAMPLES

The present invention is now explained in detail with reference to the Examples. Note that these Examples are merely illustrative, and the present invention shall in no way be limited thereby. In other words, various modifications and other embodiments are covered by the present invention, and the present invention is limited only by the scope of its claims.

Example 1

Figure 4:
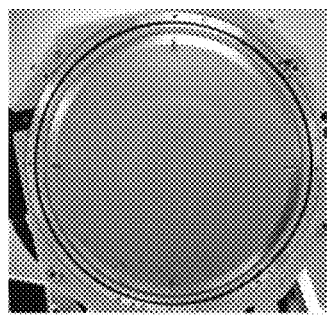
FIG. 4 is a photograph of the sputtering target (sputtering surface) of Example 1.

In a tantalum sputtering target (purity 4N5 or higher) having a diameter of 444 mm and a sputtering surface diameter of 406 mm, a machined groove having a V-shaped cross section was formed at four locations at the outer peripheral part of the target at even intervals and in parallel with the diametrical direction of the target. A photograph of this target is shown in FIG. 4. The width of the groove was 6 mm, the depth of the groove was 3 mm, the length of the groove was 13 mm on the flat part and 12 mm on the tapered part, the area ratio of the machined grooves on the flat part was 0.24%, and the area ratio of the machined grooves on the tapered part was 1.1%. Next, this target was sputtered under the following conditions, and the ignition failure rate during ignition ((number of ignition failures/number of ignition attempts)×100) was examined. Consequently, the ignition failure rate decreased significantly from 75% to 34.7% in comparison to targets of the same shape without the machined grooves.

(Ignition Test)
First step: "Gas stabilization" (5 sec)
Introduce 5 sccm of Ar gas.
Second step: "Ignition" (1 sec (5 sec up to ignition))
Apply 1000 W with a DC power supply with 5 sccm of Ar gas still introduced (Degree of vacuum: 0.2 to 0.3 mTorr)
Third step: "Vacuum drawing" (10 sec)
Perform vacuum drawing within chamber (Degree of vacuum: 1 to 3 µTorr).

The ignition test was performed with the foregoing three steps as one cycle. The success/failure of ignition was determined based on whether the real power was reached within 5 sec from the start of application in the "ignition" of the second step. If the ignition was not successful within 5 sec, the process returned to the beginning of the "ignition" of the second step, and the set power was applied once again. The application of the set power was repeated three times in the "ignition" of the second step, and "ignition failure" was determined when the ignition was not successful even after applying the set power a total of four times, and the process was consequently stopped.

Example 2

In a tantalum sputtering target (purity 4N5 or higher) having a diameter of 444 mm and a sputtering surface diameter of 406 mm, a machined groove having a V-shaped cross section was formed at four locations at the outer peripheral part of the target at even intervals and in parallel with the diametrical direction of the target. The width of the groove was 3 mm, the depth of the groove was 3 mm, the length of the groove was 13 mm on the flat part and 12 mm on the tapered part, the area ratio of the machined grooves on the flat part was 0.12%, and the area ratio of the machined grooves on the tapered part was 0.6%. Next, this target was sputtered under the same conditions as Example 1, and the ignition failure rate during ignition was examined. Consequently, the ignition failure rate decreased significantly from 75% to 31.6% in comparison to targets of the same shape without the machined grooves.

Example 3

In a tantalum sputtering target (purity 4N5 or higher) having a diameter of 444 mm and a sputtering surface diameter of 406 mm, a machined groove having a U-shaped cross section was formed at four locations only at the outer tapered part of the target at even intervals and in parallel with the diametrical direction of the target. The width of the groove was 3 mm, the depth of the groove was 3 mm, the length of the groove was 0 mm on the flat part and 12 mm on the tapered part, the area ratio of the machined grooves on the flat part was 0%, and the area ratio of the machined grooves on the tapered part was 0.6%. Next, this target was bonded to a backing plate and sputtered under the same conditions as Example 1, and the ignition failure rate during ignition ((number of ignition failures/number of ignition attempts)×100) was examined. Consequently, the ignition failure rate decreased significantly from 75% to 33.7% in comparison to targets of the same shape without the machined grooves.

Example 4

Figure 5:
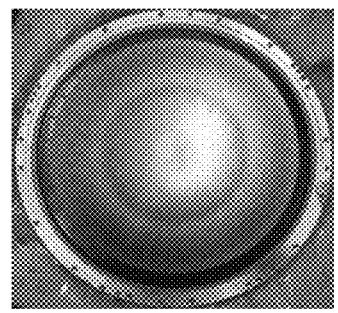
FIG. 5 is a photograph of the sputtering target (sputtering surface) of Example 4.

In a tantalum sputtering target (purity 4N5 or higher) having a diameter of 444 mm and a sputtering surface diameter of 406 mm, a machined groove having a U-shaped cross section was formed at thirty-two locations only at the outer tapered part of the target at even intervals and in parallel with the diametrical direction of the target. A photograph of this target is shown in FIG. 5. The width of the groove was 3 mm, the depth of the groove was 3 mm, the length of the groove was 0 mm on the flat part and 12 mm on the tapered part, the area ratio of the machined grooves on the flat part was 0%, and the area ratio of the machined grooves on the tapered part was 4.5%. Next, this target was sputtered under the same conditions as Example 1, and the ignition failure rate during ignition ((number of ignition failures/number of ignition attempts)×100) was examined. Consequently, the ignition failure rate decreased significantly from 75% to 7.4% in comparison to targets of the same shape without the machined grooves.

Example 5

Figure 6:
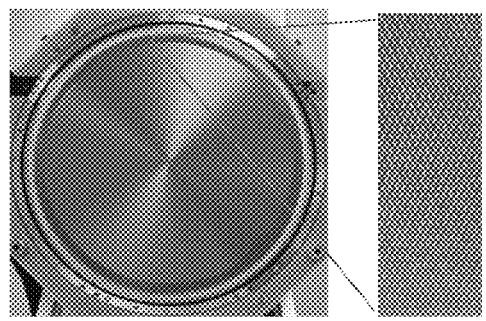
FIG. 6 is a photograph of the sputtering target (sputtering surface) of Example 5.

In a tantalum sputtering target (purity 4N5 or higher) having a diameter of 444 mm and a sputtering surface diameter of 406 mm, a machined groove having a V-shaped cross section was formed via knurling across the entire outer tapered part of the target at even intervals of 1 mm so as to foim an angle of ±45 degrees relative to the diametrical direction of the target to form a lattice pattern. A photograph of the machined grooves of this target is shown in FIG. 6. The width of the groove was 1 mm, the depth of the groove was 0.1 mm, the area ratio of the machined grooves on the flat part was 0%, and the area ratio of the machined grooves on the tapered part was 90%. Next, this target was sputtered under the same conditions as Example 1, and the ignition failure rate during ignition ((number of ignition failures/number of ignition attempts)×100) was examined. Consequently, the ignition failure rate decreased significantly from 75% to 3.2% in comparison to targets of the same shape without the machined grooves.

Example 6

In a tantalum sputtering target (purity 4N5 or higher) having a diameter of 444 mm and a sputtering surface diameter of 406 mm, a machined groove having a U-shaped cross section was formed at four locations at the outer tapered part of the target at even intervals and in parallel with the diametrical direction of the target. The width of the groove was 3 mm, the depth of the groove was 3 mm, and the length of the groove was 0 mm on the flat part and 12 mm on the tapered part. In addition, a machined groove having a V-shaped cross section was concentrically formed at the outer peripheral part, and the width of the groove was 6 mm, the depth of the groove was 3 mm, and the length of the groove was approximately 1256 mm at the outer periphery and approximately 1193 mm at the inner periphery. Based on the two types of machined grooves described above, the area ratio of the machined grooves on the tapered part was 0.6%, and the area ratio of the machined grooves on the flat part was 9.5%. Next, this target was sputtered under the same conditions as Example 1, and the ignition failure rate during ignition ((number of ignition failures/number of ignition attempts)×100) was examined. Consequently, the ignition failure rate decreased significantly from 75% to 25.3% in comparison to targets of the same shape without the machined grooves.

Example 4

Comparative Example 1

A tantalum sputtering target (purity 4N5 or higher) having a diameter of 444 mm and a sputtering surface diameter of 406 mm was prepared without any machined grooves. This target was sputtered under the same conditions as Example 1, and the ignition failure rate during ignition ((number of ignition failures/number of ignition attempts)×100) was examined. Consequently, the ignition failure rate was 75.0%.

Comparative Example 2

Figure 7:
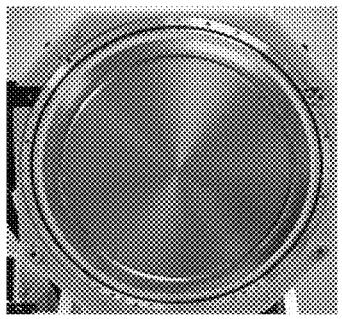
FIG. 7 is a photograph of the sputtering target (sputtering surface) of Comparative Example 2.

In a tantalum sputtering target (purity 3N5 or higher) having a diameter of 444 mm, a machined groove having a V-shaped cross section was concentrically formed at the outer peripheral part of the target. A photograph of this target is shown in FIG. 7. The width of the groove was 6 mm, the depth of the groove was 3 mm, the length of the groove was approximately 1256 mm at the outer periphery and approximately 1193 mm at the inner periphery, the area ratio of the machined groove on the flat part was 9.5%, and the area ratio of the machined groove on the tapered part was 0%. Next, this target was sputtered under the same conditions as Example 1, and the ignition failure rate during ignition ((number of ignition failures/number of ignition attempts)×100) was examined. Consequently, the ignition failure rate decreased from 75% to 70.9%, but a significant decrease could not be observed in comparison to targets of the same shape without the machined grooves.

Comparative Example 3

In a tantalum sputtering target (purity 3N5 or higher) having a diameter of 444 mm, a machined groove having a V-shaped cross section was concentrically formed at the outer peripheral part of the target. The width of the groove was 14 mm, the depth of the groove was 3 mm, the length of the groove was approximately 1237 mm at the outer periphery and approximately 1150 mm at the inner periphery, the area ratio of the machined groove on the flat part was 11.1%, and the area ratio of the machined groove on the tapered part was 0%. Next, this target was sputtered under the same conditions as Example 1, but because the current value during sputtering decreased and a phenomenon of unstable sputtering power was observed, the evaluation was discontinued.

Comparative Example 4

In a tantalum sputtering target (purity 4N5 or higher) having a diameter of 444 mm and a sputtering surface diameter of 406 mm, a machined groove having a U-shaped cross section was formed at four locations only at the outer flat part of the target at even intervals and in parallel with the diametrical direction of the target. The width of the groove was 6 mm, the depth of the groove was 3 mm, the length of the groove was 13 mm on the flat part and 0 mm on the tapered part, the area ratio of the machined grooves on the flat part was 0.24%, and the area ratio of the machined grooves on the tapered part was 0%. Next, this target was bonded to a backing plate and sputtered under the following conditions, and the ignition failure rate during ignition ((number of ignition failures/number of ignition attempts)× 100) was examined. Consequently, the ignition failure rate decreased from 75% to 68.5%, but a significant decrease could not be observed in comparison to targets of the same shape without the machined grooves.

The above results are summarized in table 1.

TABLE 1

| | Machined location | Machined shape | Tapered part machined groove area ratio | Flat part machined groove area ratio | Ignition failure rate |
|---|---|---|---|---|---|
| Example 1 | Flat part + Tapered part | 4 radial machined grooves (Width: 6 mm, Depth: 3 mm, Length: Flat part 13 mm, Tapered part 12 mm) | 1.1% | 0.24% | 34.7% |
| Example 2 | Flat part + Tapered part | 4 radial machined grooves (Width: 3 mm, Depth: 3 mm, Length: Flat part 13 mm, Tapered part 12 mm) | 0.6% | 0.12% | 31.6% |
| Example 3 | Tapered part | 4 radial machined grooves (Width: 3 mm, Depth: 3 mm, Length: Flat part 0 mm, Tapered part 12 mm) | 0.6% | 0.0% | 33.7% |
| Example 4 | Tapered part | 32 radial machined grooves (Width: 3 mm, Depth: 3 mm, Length: Flat part 0 mm, Tapered part 12 mm) | 4.5% | 0.0% | 7.4% |
| Example 5 | Tapered part | Entire surface of 45-degree intersecting machined groove (Width: 1 mm, Depth: 0.1 mm, Length: Flat part 0 mm, Tapered part 28 mm) | 90% | 0.0% | 3.2% |
| Example 6 | Flat part + Tapered part | Concentric machined groove (Width: 6 mm, Depth: 3 mm, Outer periphery: 1256 mm, Inner periphery: 1193 mm) 4 radial machined grooves (Width: 3 mm, Depth: 3 mm, Length: Flat part 0 mm, Tapered part 12 mm) | 0.6% | 9.5% | 25.3% |
| Comparative Example 1 | — | No machined groove (shape of reference example) | 0.0% | 0.0% | 75% |
| Comparative Example 2 | Flat part | Concentric machined groove (Width: 6 mm, Depth: 3 mm, Outer periphery: 1256 mm, Inner periphery: 1193 mm) | 0.0% | 9.5% | 70.5% |
| Comparative Example 3 | Flat part | Concentric machined groove (Width: 14 mm, Depth: 3 mm, Outer periphery: 1237 mm, Inner periphery: 1150 mm) | 0.0% | 11.1% | — |
| Comparative Example 4 | Flat part | 4 radial machined grooves (Width: 6 mm, Depth: 3 mm, Length: Flat part 13 mm, Tapered part 0 mm) | 0.0% | 0.24% | 68.5% |

The sputtering target of the present invention can start the sputtering process stably by reducing the ignition failure rate during ignition (plasma ignition) even under conditions where the introduced gas has decreased or the voltage application time is shortened or the like. Since it is thereby possible to shorten the downtime of the device, the present invention can contribute to improved throughput and enhanced cost performance. The sputtering target of the present invention is useful for forming thin films for electronic devices.

The invention claimed is:

1. A sputtering target having a sputtering surface comprising a flat part and a tapered part surrounding the flat part and limited by the periphery of the sputtering surface, wherein one or more machined grooves are arranged in the tapered part or in both of the tapered part and the flat part, and wherein a total area of the one or more machined grooves covering the tapered part has an area ratio of 0.6% or more and 4.5% or less to an area of the tapered part.

2. The sputtering target according to claim 1, wherein the total area of the one or more machined grooves covering both of the tapered part and the flat part has an area ratio of 10% or less to an area of the flat part.

3. The sputtering target according to claim 2, wherein a depth of the one or more machined grooves is 0.1 mm or more.

4. The sputtering target according to claim 3, wherein the sputtering target is formed from tantalum having a purity of 4N5 or higher.

5. The sputtering target according to claim 4, wherein a cross-section shape of the one or more machined grooves is a V-shape, a U-shape, or a square shape.

6. The sputtering target according to claim 5, wherein the one or more machined grooves are of a radial shape, a lattice shape, or a concentric shape, the lattice shape being formed with two differently oriented and intersecting groups of grooves.

7. The sputtering target according to claim 5, wherein the one or more machined grooves are positioned in an outer peripheral part of the sputtering surface, the outer peripheral part being defined by the periphery of the sputtering surface and a periphery of an area which is centered at the center of the sputtering surface and has a radial size equivalent to a half of a radial distance from the center to the periphery of the sputtering surface.

8. The sputtering target according to claim 1, wherein a depth of the one or more machined grooves is 0.1 mm or more.

9. The sputtering target according to claim 1, wherein the sputtering target is formed from tantalum having a purity of 4N5 or higher.

10. The sputtering target according to claim 1, wherein a cross-section shape of the one or more machined grooves is a V-shape, a U-shape, or a square shape.

11. The sputtering target according to claim 1, wherein the one or more machined grooves are of a radial shape, a lattice shape, or a concentric shape, the lattice shape being formed with two differently oriented and intersecting groups of grooves.

12. The sputtering target according to claim 1, wherein the one or more machined grooves are positioned in an outer peripheral part of the sputtering surface, the outer peripheral part being defined by the periphery of the sputtering surface and a periphery of an area which is centered at the center of the sputtering surface and has a radial size equivalent to a half of a radial distance from the center to the periphery of the sputtering surface.

13. The sputtering target according to claim 1, wherein the one or more machined grooves are positioned to contribute to generation and stabilization of plasma ignition.

14. The sputtering target according to claim 1, wherein a width of each of the one or more machined grooves is at least 3 mm.

15. The sputtering target according to claim 1, wherein a width of each of the one or more machined grooves is 3 mm to 6 mm.

16. The sputtering target according to claim 15, wherein the one or more machined grooves consists of 1 to 32 machined grooves in total.

17. The sputtering target according to claim 16, wherein the sputtering target has a diameter of 444 mm.

* * * * *